United States Patent
Bauer et al.

(10) Patent No.: US 6,262,597 B1
(45) Date of Patent: Jul. 17, 2001

(54) FIFO IN FPGA HAVING LOGIC ELEMENTS THAT INCLUDE CASCADABLE SHIFT REGISTERS

(75) Inventors: Trevor J. Bauer, San Jose; Bruce A. Newgard, Ramona, both of CA (US); William E. Allaire, Westchester Drive, PA (US); Steven P. Young, San Jose, CA (US)

(73) Assignee: Xilinx, Inc., San Jose, CA (US)

( * ) Notice: Subject to any disclaimer, the term of this patent is extended or adjusted under 35 U.S.C. 154(b) by 32 days.

(21) Appl. No.: 09/624,515

(22) Filed: Jul. 24, 2000

Related U.S. Application Data

(60) Division of application No. 09/253,313, filed on Feb. 18, 1999, now Pat. No. 6,118,298, which is a continuation-in-part of application No. 08/754,421, filed on Nov. 22, 1996, now Pat. No. 5,889,413.

(51) Int. Cl.[7] .................................................. H03K 19/177
(52) U.S. Cl. .................................................. 326/41; 326/40
(58) Field of Search .......................................... 326/37–41

(56) References Cited

U.S. PATENT DOCUMENTS

| | | |
|---|---|---|
| Re. 34,363 | 8/1993 | Freeman . |
| 4,821,233 | 4/1989 | Hsieh . |
| 4,870,302 | 9/1989 | Freeman . |
| 4,967,107 | 10/1990 | Kaplinsky . |
| 5,267,187 | 11/1993 | Hsieh et al. . |
| 5,291,079 | 3/1994 | Goetting . |
| 5,321,399 | 6/1994 | Notani et al. . |
| 5,325,109 | 6/1994 | Duckworth . |
| 5,343,406 | 8/1994 | Freeman et al. . |
| 5,349,250 | 9/1994 | New . |
| 5,352,940 | 10/1994 | Watson . |
| 5,386,156 | 1/1995 | Britton et al. . |
| 5,394,031 | 2/1995 | Britton et al. . |
| 5,414,377 | 5/1995 | Freidin . |
| 5,422,823 | 6/1995 | Agrawal et al. . |
| 5,442,306 | 8/1995 | Woo . |
| 5,488,316 | 1/1996 | Freeman et al. . |
| 5,694,056 | 12/1997 | Mahoney et al. . |
| 5,787,007 | * 7/1998 | Bauer ...................................... 326/41 |

OTHER PUBLICATIONS

Xilinx, Inc., "The Programmable Logic Data Book," 1996, available from Xilinx, Inc., 2100 Logic Drive, San Jose, California 95124, pp. 4–1 through 4–372.

* cited by examiner

Primary Examiner—Michael Tokar
Assistant Examiner—Don Le
(74) Attorney, Agent, or Firm—Edel M. Young

(57) ABSTRACT

A set of logic elements can be configured as a cascadable shift register. In one embodiment, a logic element for an FPGA can be configured as any one of a random access memory, a cascadable shift register and a lookup table. The data-in path to the shift register includes a cascade multiplexer for optionally forming large shift registers using multiple logic elements. Each logic element includes a plurality of memory cells which are interconnected such that the data output of each memory cell can serve as the input to the next memory cell, causing the logic element to function as a shift register. The cascade multiplexer allows the last bit of one logic element to be connected to the first bit of the next logic element, bypassing any decode logic of the lookup table. Variable tap shift registers of arbitrary length can be created by cascading lookup tables of plural logic elements in series. The lookup table decode logic plus additional multiplexers can be used to select any memory cell (not necessarily the last memory cell) of the shift register.

4 Claims, 12 Drawing Sheets

64-Bit Variable Length Shift Register for FIFO

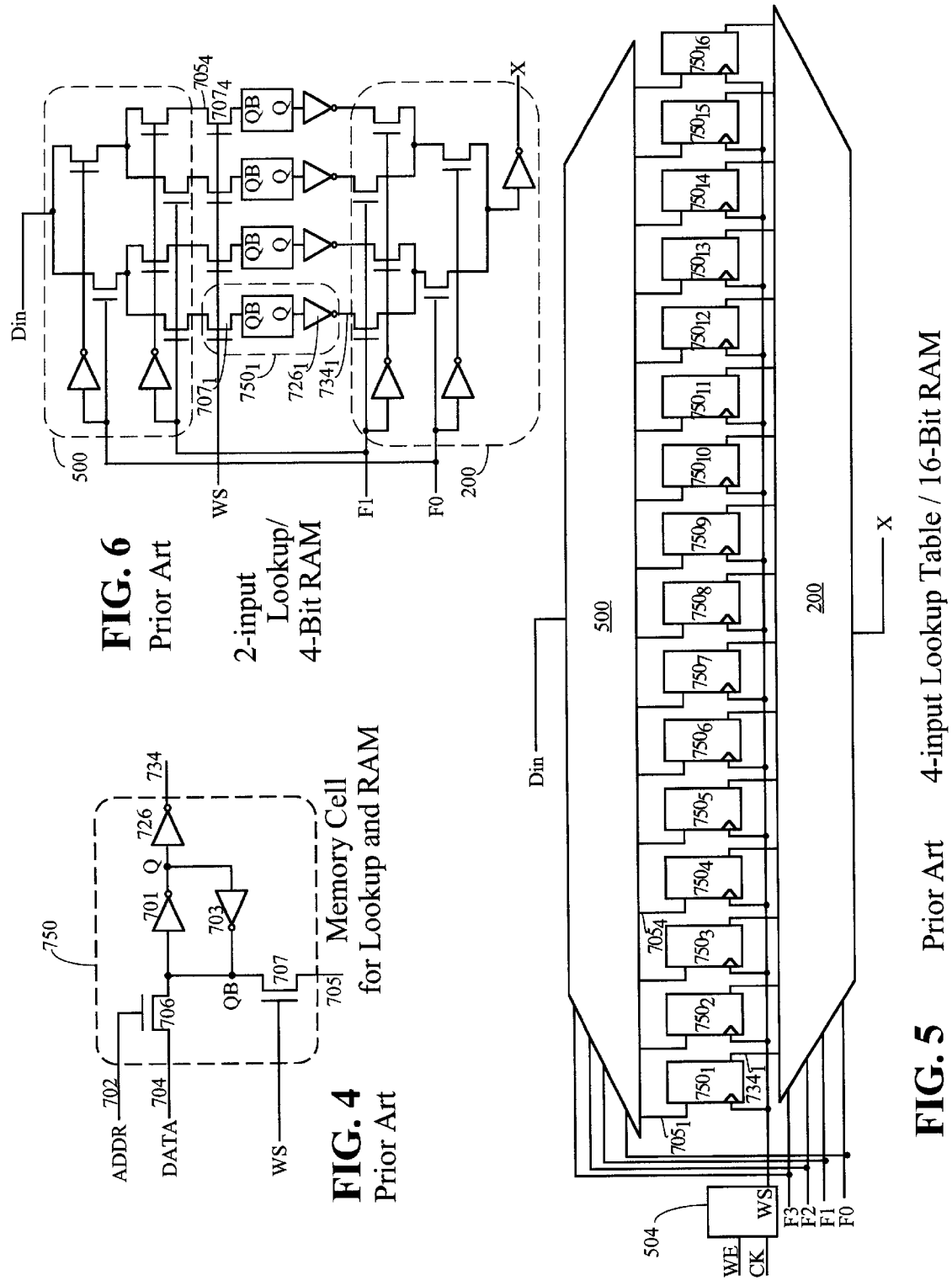

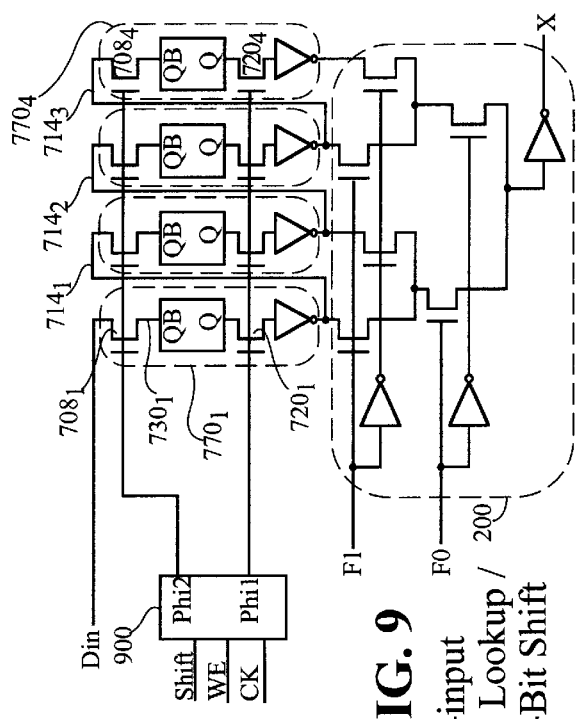
FIG. 9 2-input Lookup / 4-Bit Shift
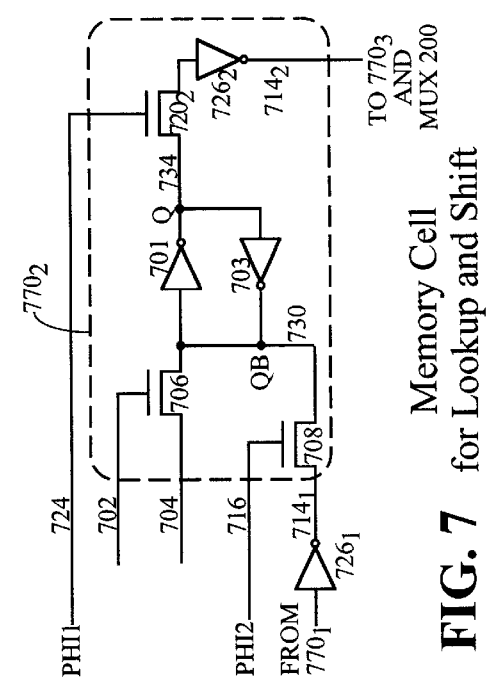
FIG. 7 Memory Cell for Lookup and Shift
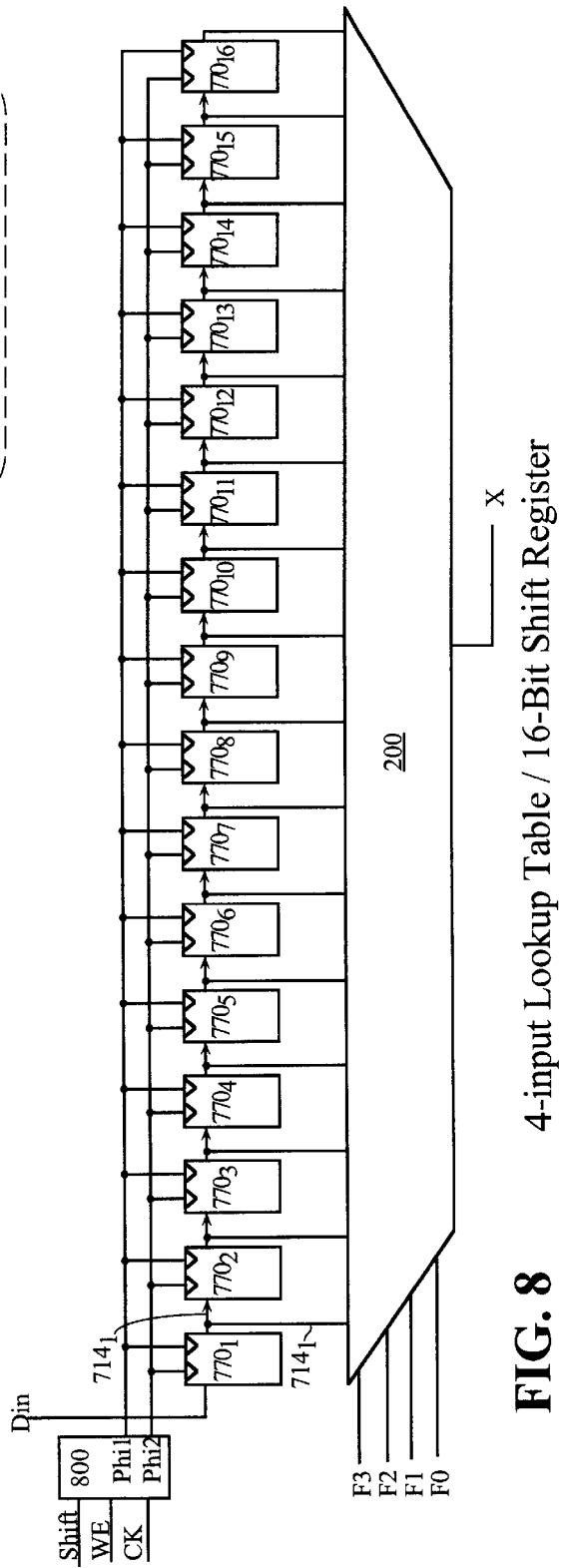
FIG. 8 4-input Lookup Table / 16-Bit Shift Register

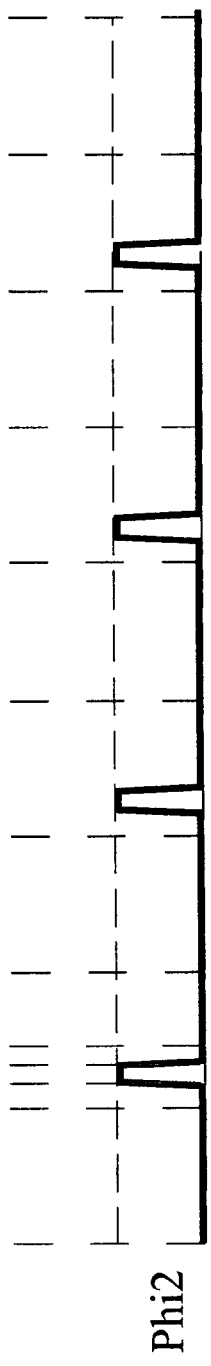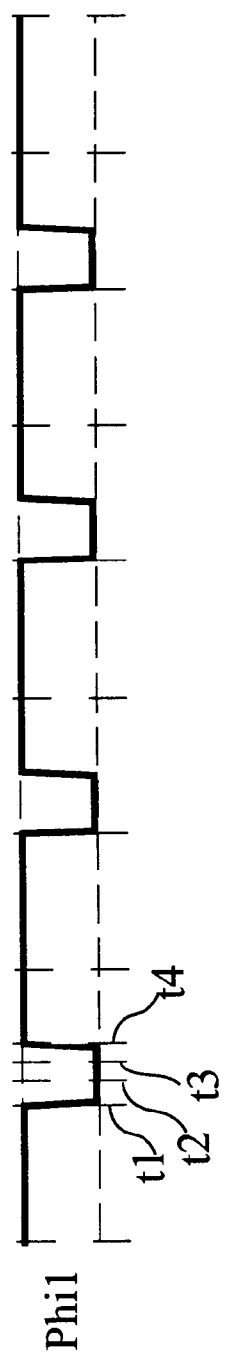

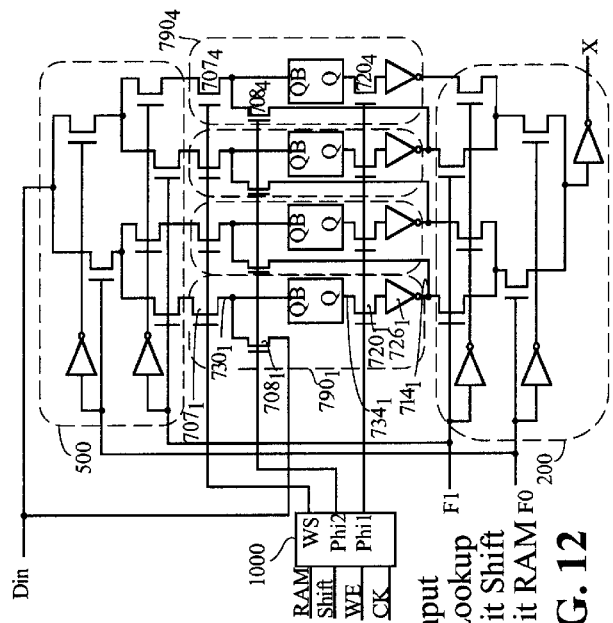
2-input Lookup
4-Bit Shift
4-Bit RAM
FIG. 12
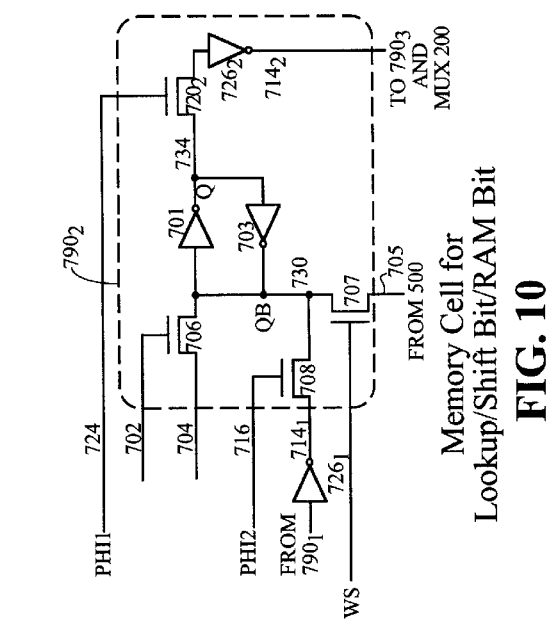
Memory Cell for
Lookup/Shift Bit/RAM Bit
FIG. 10
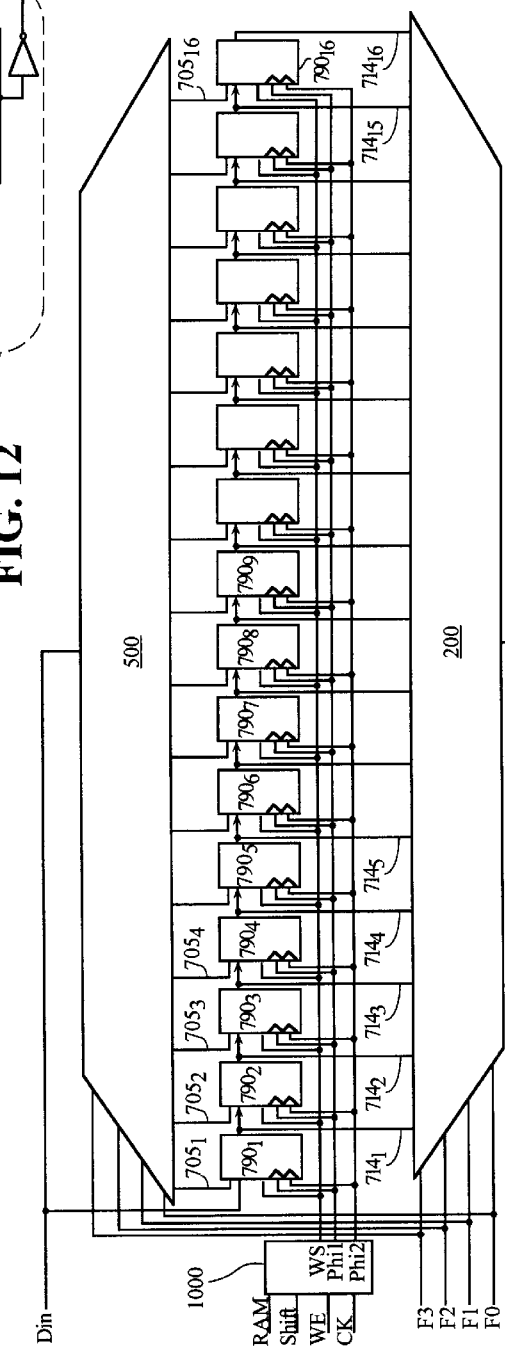
FIG. 11  4-input Lookup Table / 16-Bit Shift Register / 16-Bit RAM 64-Bit Variable Length Shift Register for FIFO

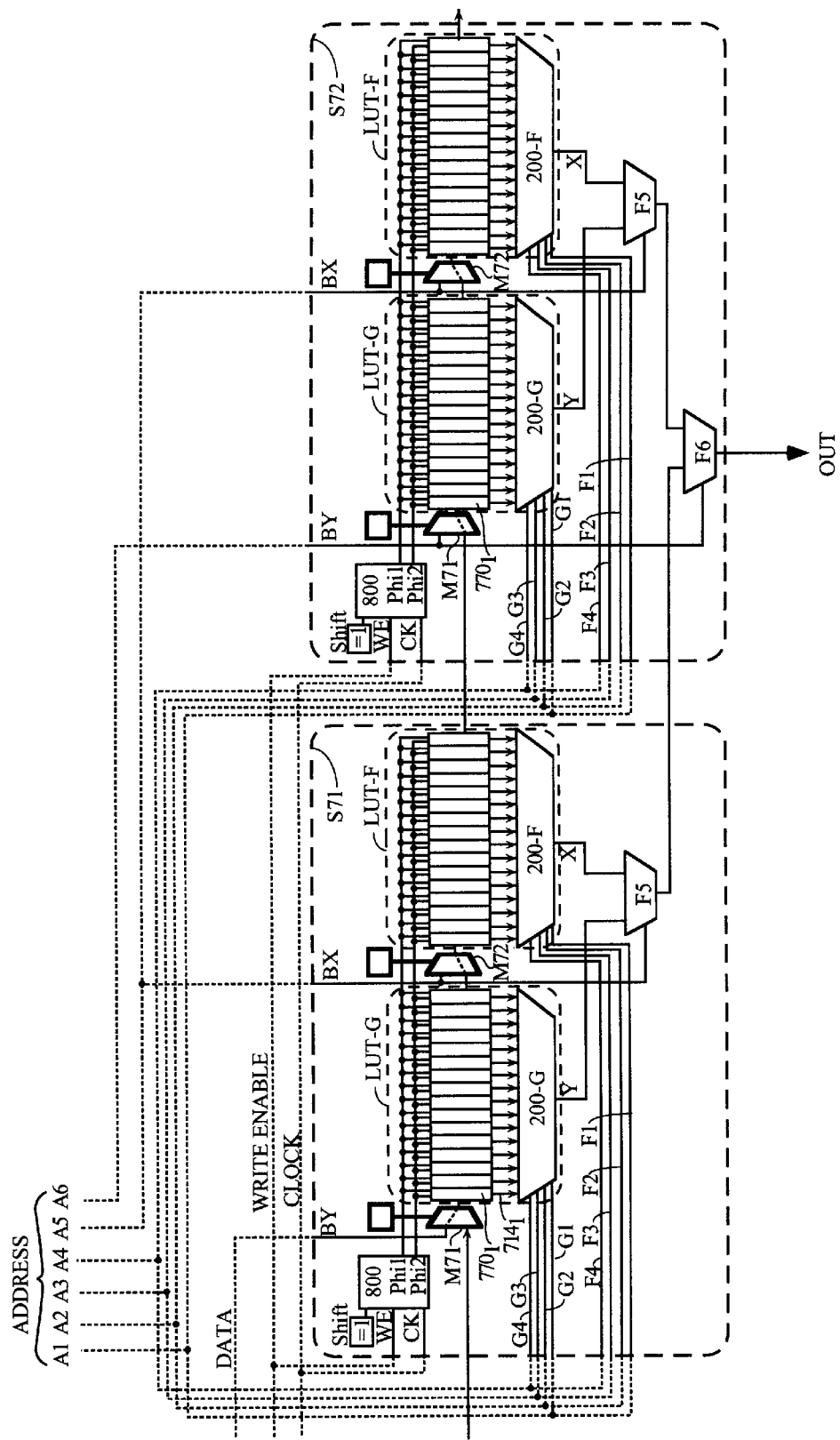
FIG. 17 64-Bit Variable Length Shift Register for FIFO

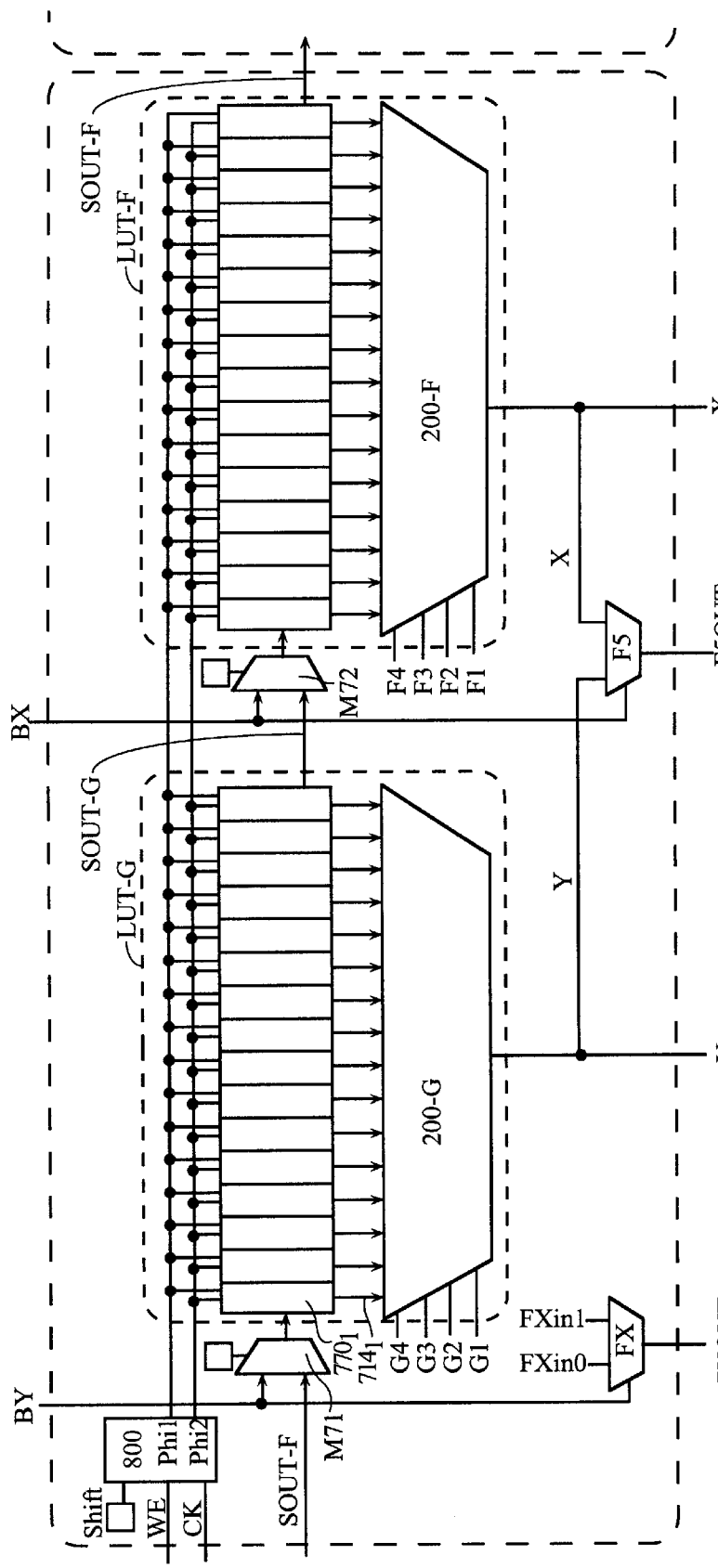
FIG. 18  Logic Slice for Variable Length Shift Register

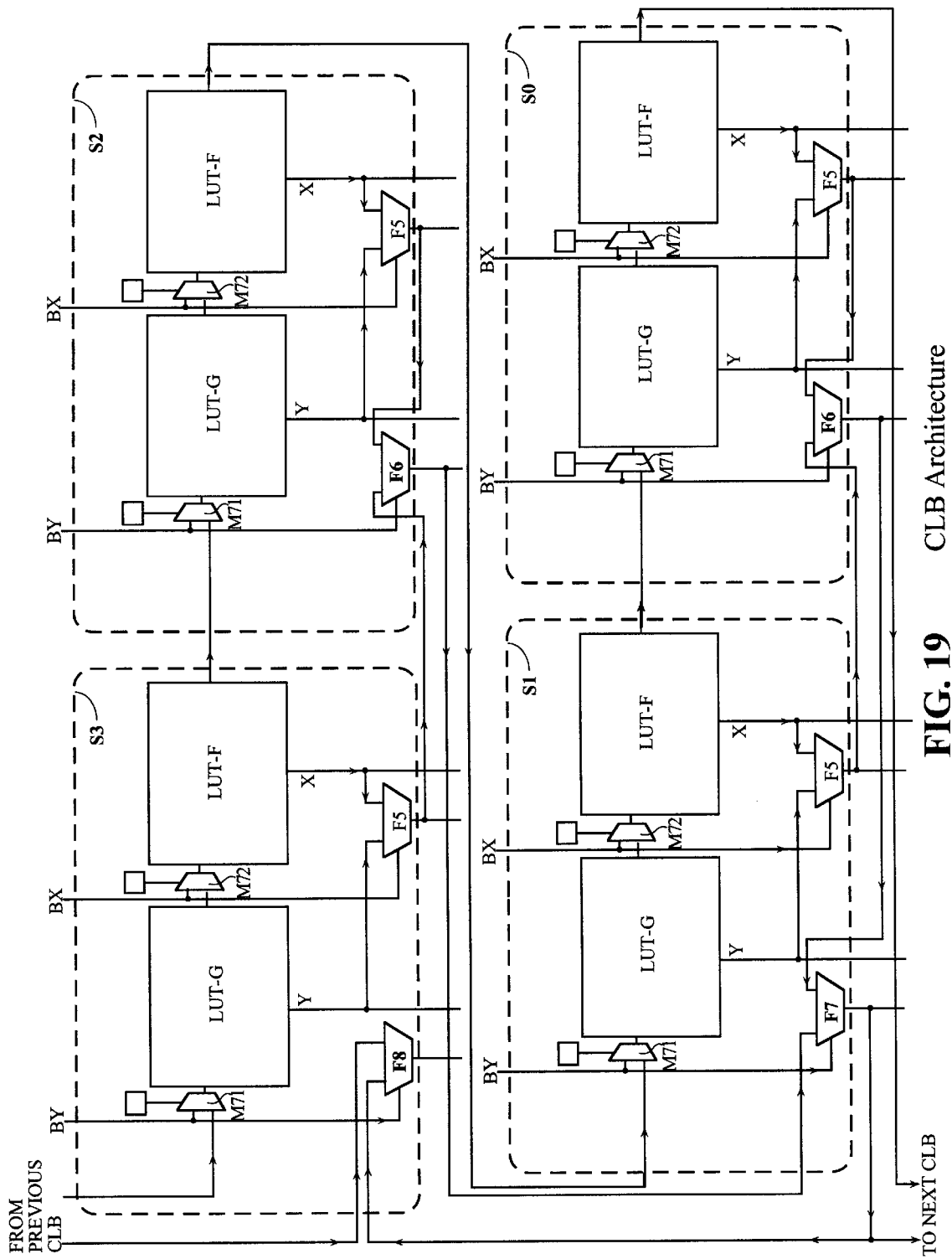
FIG. 19   CLB Architecture

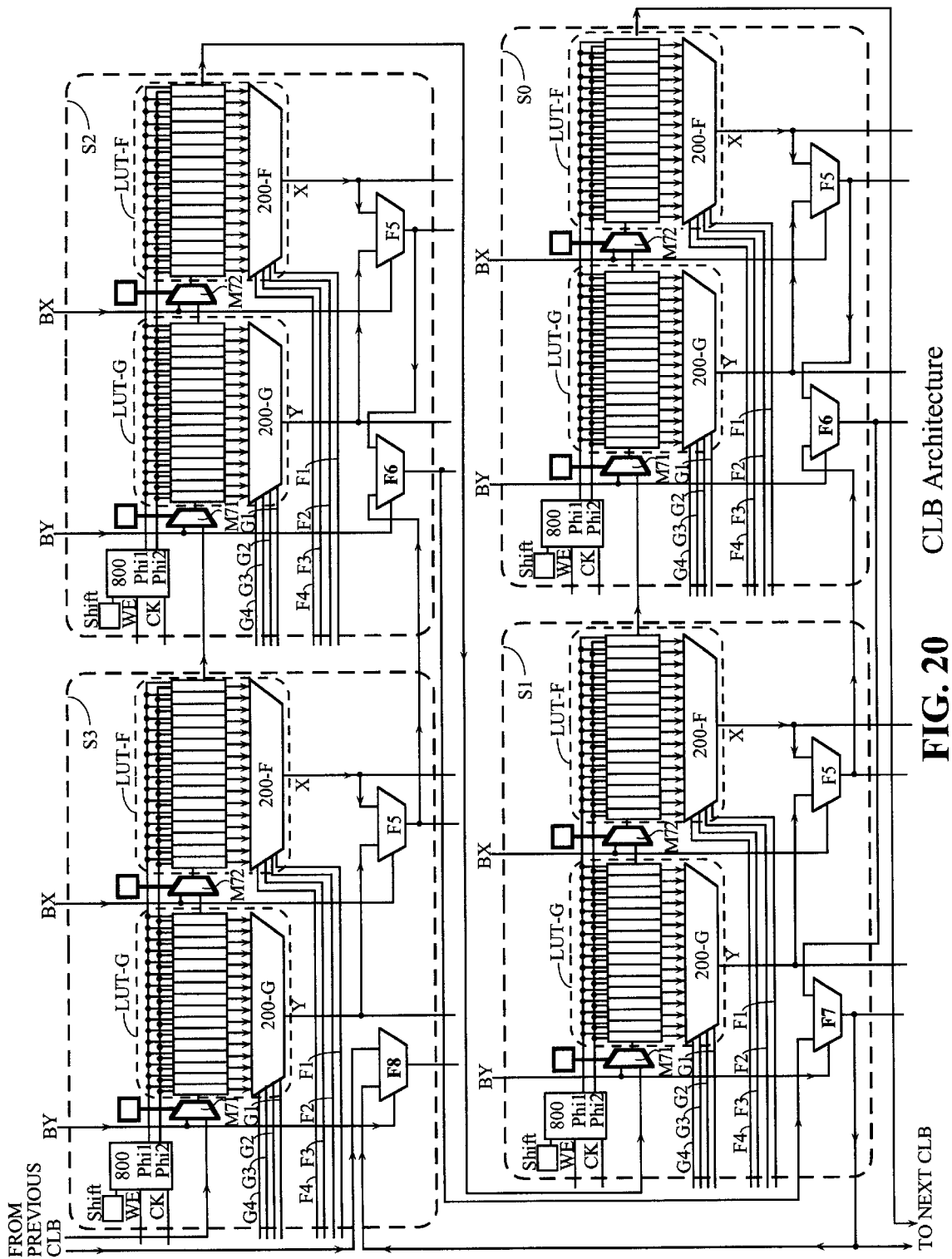
FIG. 20    CLB Architecture

FIFO IN FPGA HAVING LOGIC ELEMENTS THAT INCLUDE CASCADABLE SHIFT REGISTERS

RELATED APPLICATION

This application is divisional application of U.S. patent application Ser. No. 09/253,313 filed Feb. 18, 1999 now U.S. Pat. No. 6,118,298, which is a continuation-in-part of application Ser. No. 08/754,421 filed Nov. 22, 1996, now U.S. Pat. No. 5,889,413 issued Mar. 30, 1999, the contents of which are incorporated herein by reference.

FIELD OF THE INVENTION

This invention relates to means and methods of customizing reprogrammable logic functions in an integrated circuit logic device.

BACKGROUND OF THE INVENTION

Xilinx, Inc. the assignee of the present application, manufactures FPGAs, the complexity of which continues to increase. Freeman in U.S. Pat. No. Reissue 34,363, incorporated herein by reference, which is a re-issue of original U.S. Pat. No. 4,870,302, describes the first FPGA. An FPGA is an integrated circuit chip which includes a plurality of programmable input/output pads, a plurality of configurable logic elements, and a programmable interconnect structure for interconnecting the plurality of logic elements and pads. Each logic element implements a logic function of the n inputs to the logic element according to how the logic element has been configured. Logic functions may use all n inputs to the logic element or may use only a subset thereof. A few of the possible logic functions that a logic element can be configured to implement are: AND, OR, XOR, NAND, NOR, XNOR and mixed combinations of these functions.

One disclosed implementation of the logic element includes a configurable lookup table which is internal to the logic element and which includes $2^n$ individual memory cells, where n is the number of input signals the lookup table can handle. At configuration, in this architecture a bitstream programs the individual memory cells of the lookup table with a desired function by writing the truth table of the desired function to the individual memory cells. Although the programming is described as being performed serially, other techniques for parallel programming are also known.

One memory cell architecture appropriate for use in the lookup tables is shown in FIG. 1 and described by Hsieh in U.S. Pat. No. 4,821,233, incorporated herein by reference. A memory cell of this architecture is programmed by applying the value to be written to the memory cell on the data input line, "Data," and strobing the corresponding address line, "ADDR." Further, although this architecture uses five transistors, other known configurations, e.g., six transistor static memory cells, also are appropriate choices for implementing the memory cells of the lookup table. As shown in FIG. 1, inverter 726 may be included to increase the drive of memory cell 700.

After configuration, to use a lookup table, the input lines of the configured logic element act as address lines which select a corresponding memory cell in the lookup table. For example, a logic element configured to implement a two-input NAND gate would output the corresponding value {1, 1, 1, or 0} contained in the one of the four memory cells corresponding to the current input pair {00, 01, 10, 11}, respectively.

This selection is performed by a decoding multiplexer which selects a memory cell from the lookup table on the basis of the logic levels of the input lines. A block diagram of an exemplary four-input lookup table composed of 16 memory cells $700_1$ through $700_{16}$ and a decoding multiplexer 200 is shown in FIG. 2. The multiplexer propagates a value stored in one of the memory cells $700_1$–$700_{16}$ of the lookup table to an output X of the lookup table as selected by the four input signals F0–F3.

FIG. 3 is a schematic diagram of another embodiment of a lookup table. In this embodiment, the lookup table is implemented using four memory cells $700_1$–$700_4$ and a two-input decoding multiplexer 200 with two input signals, F0 and F1. The two-input decoding multiplexer 200 is shown in detail as being implemented by a hierarchy of pass transistors which propagate the value stored in the selected memory cell to the output X of the logic element. In FIG. 3, the memory cells may be implemented as shown in FIG. 1.

The above architecture was later augmented to enhance the functionality of the lookup tables. U.S. Pat. No. 5,343,406 to Freeman et al., incorporated herein by reference, describes how additional circuitry can enable lookup tables to behave as random access memories (RAMs) which can be both read and written after configuration of the logic device. When the option of allowing the user to write data to memory cells is available, there also must be provision for entering the user's data into these memory cells and reading from the memory cells. This capability is provided by including two means for accessing each dual function memory cell, one which is used to supply the configuration bitstream from off the chip, and another which is used during operation to store signals that are routed from the interconnect lines of the FPGA. FIG. 4 shows the memory cell architecture described in U.S. Pat. No. 5,343,406 which allows memory cell 750 to be programmed both during and after configuration. During configuration, memory cell 750 is programmed using the same process for programming the memory cell of FIG. 1.

After configuration, memory cell 750 is programmed differently. A value to be written to memory cell 750 is applied through the interconnect structure of the FPGA to the second data line 705, and then the corresponding write-strobe line WS for the memory cell is pulsed. This pulse latches the value on line 705 into memory cell 750. Like the lookup table of FIG. 2 which uses a series of memory cells from FIG. 1, a series of memory cells from FIG. 4 are combinable into a lookup table.

FIG. 5 is a block diagram showing a four-input lookup table with synchronous write capability. There is a write strobe generator 504 which receives a clock signal, CK, and a write enable signal, WE, and creates a single write strobe signal, WS, for the lookup table. To write a value to a desired memory cell, say $750_5$, the value is applied on line $D_{in}$ and the address of the desired memory cell $750_5$ is applied to the input lines F0–F3 of demultiplexer 500. The value then is latched into the desired memory cell $750_5$ by pulsing the write strobe. Conversely, to read a value stored in a different desired memory cell $750_3$, the address of the memory cell $750_3$ is applied to the input lines F0–F3 of decoding multiplexer 200 (without pulsing the write strobe), as was described with reference to FIGS. 2 and 3.

FIG. 6 is a schematic illustration of a two-input lookup table with synchronous write capability. FIG. 6 includes four memory cells $750_1$ through $750_4$. Detail of demultiplexer 500 and multiplexer 200 is shown in FIG. 6.

The implementation and operation of other logic array devices are described in "The Programmable Logic Data Book," pages 4-1 to 4-372, copyright 1996 by Xilinx, available from Xilinx, Inc., 2100 Logic Drive, San Jose, Calif. 95124. This portion of "The Programmable Logic Data Book" is incorporated herein by reference.

SUMMARY OF THE INVENTION

The present invention provides means and method for programming a configurable logic element so that the logic element can implement any one of a shift register and a combinatorial logic function using a lookup table. In one embodiment, the invention further provides for implementing a random access memory in this same logic element. The lookup table includes a plurality of memory cells which are connected in series so that an output of a first memory cell is configurable as an input to a second memory cell of the same lookup table. Further, by connecting shift registers of plural logic elements in series, larger shift registers can be built from smaller shift registers. Previous architectures built n-bit shift registers out of n flip flops connected in series, thereby wasting interconnect resources and logic while achieving mediocre performance.

In one mode, the memory cells which store the lookup table values are used as registers in a shift chain. When the logic element is in shift register mode, the Data-in value is shifted into the first cell and the value in each memory cell is shifted to the next cell. When the logic element is in random access memory mode, the Data-in value is written to a cell addressed by F3–F0, as discussed above. When the logic element is in pure lookup table mode, no value can be written after configuration and the logic element continues to generate the function loaded in during configuration.

According to another aspect of the invention, shift registers formed in a single lookup table can be cascaded together through cascade multiplexers to form larger shift registers. Each cascade multiplexer receives two input signals, the output signal from the last memory cell in a previous lookup table, and an input signal from the interconnect structure (or other selectable source). The output signal from the cascade multiplexer provides the input signal to the first memory cell in the next lookup table.

According to yet another aspect of the invention, a hierarchy of multiplexers is provided to generate functions of more inputs than the lookup table can handle. For example, a lookup table having 16 memory cells can generate functions of four input signals. By combining the outputs of two lookup tables in a multiplexer (F5) controlled by a fifth input signal, any function of five input signals can be generated. Using a sixth signal to select between the outputs of two such F5 multiplexers allows any function of six input signals to be generated, and so forth. In one embodiment, a configurable logic block (CLB) includes four slices, each having two four-input lookup tables (a total of eight lookup tables). The multiplexer hierarchy allows for all functions of eight input signals to be generated by selecting the output signal of one of the 16 lookup tables in a pair of CLBs. In addition to the eight lookup tables that generate functions of four input signals, the CLB includes four F5 multiplexers, where each F5 multiplexer receives input signals from two lookup tables and can generate all functions of five input signals when the two lookup tables receive the same four input signals and the F5 multiplexer is controlled by the fifth input signal. The CLB also includes two F6 multiplexers where each F6 multiplexer receives input signals from two of the F5 multiplexers. The CLB further includes an F7 multiplexer which receives the two F6 signals. The CLB also includes an F8 multiplexer which receives the F7 multiplexer output signal and an F7 multiplexer output signal from an adjacent CLB.

In one embodiment, this hierarchy of eight multiplexers is controlled by the same lines that provide shift register input signals. In this embodiment, the eight lookup tables are paired into 4 slices so that the downstream lookup table in each slice receives a shift register input signal on the line that also controls the F5 multiplexer for the slice. The upstream lookup table of the slice receives a shift register input signal on the line that controls an F6, F7 or F8 multiplexer. This arrangement is advantageous because the structure can be configured as a variable length shift register, where the line carrying the most upstream signal is used for loading shift register data and the more downstream lines all control multiplexers.

BRIEF DESCRIPTION OF THE DRAWINGS

FIG. 4 is a schematic illustration of a second prior art memory cell architecture used in lookup tables where the value of the memory cell is stored at configuration and remains dynamically readable and writable after configuration.

FIG. 5 is a block diagram of a prior art logic element that is configurable to implement either a sixteen-by-one random access memory or a four-input lookup table.

FIG. 6 is a schematic illustration of a prior art logic element that is configurable to implement either a four-bit random access memory or a two-input lookup table.

FIG. 7 is a schematic illustration of a memory cell architecture according to the present invention which can alternatively be configured as a shift register or a lookup table.

FIGS. 7A and 7B are waveform diagrams showing non-overlapping signals Phi1 and Phi2 which cause a bit value to shift from a preceding memory cell into the current memory cell when Phi2 is asserted.

FIG. 8 is a block diagram of a logic element according to the invention that can implement either a four-input lookup table or a 16-bit shift register.

FIG. 9 is a circuit diagram of a logic element according to the invention that can implement either a 2-input lookup table or a 4-bit shift register, where the mode of the logic element controls the operation of the control logic, and may be stored in configuration memory.

FIG. 10 is a schematic illustration of a memory cell for implementing any of a lookup table, a shift register, or a RAM.

FIG. 11 is a block diagram of a logic element that is configurable to implement any one of a four-input lookup table, a sixteen-bit shift register, and a sixteen-bit random access memory.

FIG. 12 is a schematic diagram of a logic element according to the present invention that is configurable to implement any one of a two-input lookup table, a four-bit shift register, and a four-bit random access memory.

FIGS. 13A through 13H shows waveform diagrams of the operation of the logic element when configured in shift-register mode.

FIG. 17 shows a 64-bit variable length shift register formed using an architecture with an advantageous modification to the structure of FIG. 8.

FIG. 18 shows a logic slice structure from which the 64-bit variable length shift register of FIG. 17 can be formed.

FIG. 19 shows a layout of wiring for cascading adjacent lookup table slices by which interiors of adjacent lookup table slices can be identically laid out.

FIG. 20 shows more detail of the structure of FIG. 19, illustrating the lookup table structures.

DETAILED DESCRIPTION

Figure 1:
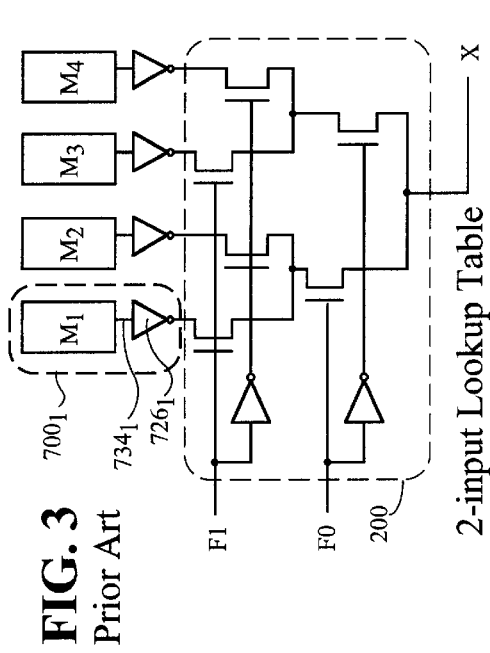
FIG. 1 is a schematic illustration of a first prior art memory cell architecture used in lookup tables in FPGAs where a value of the memory cell is stored during configuration.
Figure 3:
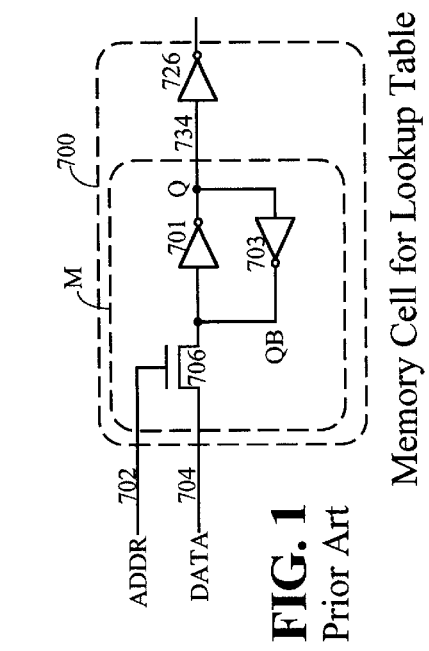
FIG. 3 is an expanded view of a schematic illustration of a prior art two-input lookup table and a decoding multiplexer implemented by a hierarchy of pass gates.
Figure 2:
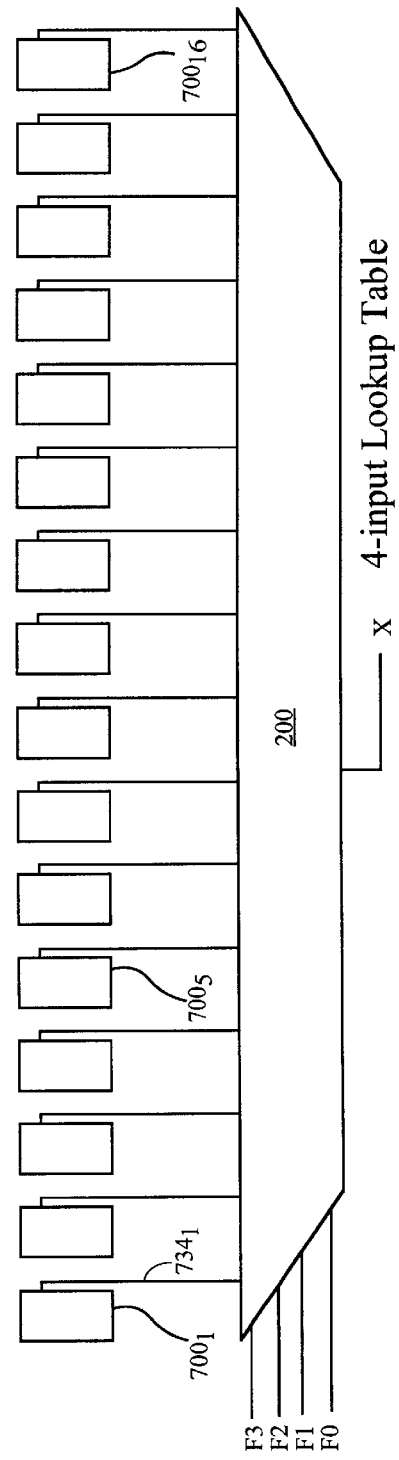
FIG. 2 is a block diagram of a prior art programmable 4-input look-up table implemented by a sixteen-to-one decoding multiplexer and a series of sixteen memory cells.

With an increase in logic gate density, a shift register can now be implemented as one element of a larger user-configurable integrated circuit logic array. In a first embodiment of the present invention, a logic element is configurable to implement both an n-bit shift register and a ($\log_2$ n)-input lookup table. FIG. 7 shows a schematic illustration of a memory cell $770_2$ of the logic element architecture according to the present invention which, when configured to be in shift register mode, advantageously enables a value to be shifted from a preceding memory cell $770_1$ into the memory cell $770_2$. Memory cell $770_2$ includes a pass transistor 706. The configuration value is written into memory cell $770_2$ by pulsing configuration control line 702 of transistor 706, while applying the configuration value to the data line 704.

The output of memory cell $770_2$ is programmably connected to the input of a next memory cell $770_3$ by pass transistors $720_2$, inverter $726_2$, and a next pass transistor $708_3$ not shown in FIG. 7. As shown by the timing diagrams in FIGS. 7A and 7B, during most of each cycle the clocking signal Phi1 on output control line 724 remains high, and thus the output signal $734_2$ of memory cell $770_2$ is applied through inverter $726_2$ to shift input line $714_2$ leading to the next memory cell $770_3$. When Phi1 goes low at time t1, pass transistor $720_2$ is turned off. Inverter $726_2$ continues for a short time to hold as an output signal the logic level previously asserted by memory cell $770_2$. In this way, the combination of transistor $720_2$ and inverter $726_2$ serves as a temporary latch. When a second clocking signal, Phi2, is asserted at time t2 on input control line 716, inverter 701 receives both the output of inverter 703 of memory cell $770_2$ and the output of inverter $726_1$ of the previous memory cell $770_1$. Each inverter 726 is designed to overpower the inverter 703 so that values can be shifted between adjacent memory cells. Therefore, the current value stored in memory cell $770_2$ is overwritten by the output of the previous memory cell $770_1$. When Phi2 returns low at time t3, memory cell $770_2$ is once again latched, holding its current value independent of changes in shift input line $714_1$. At time t4, Phi1 goes high, thus applying the new value to inverter $726_2$. Thus in one clock cycle, a bit shifts one cell. In contrast, if Phi1 and Phi2 mistakenly overlapped, the value of the output 734 of each memory cell 770 would propagate from preceding memory cell $700_1$ through memory cell $770_2$ to the next memory cell $770_3$. This would not produce the desired single bit shift. However, by using non-overlapping two-phase clocking, as shown in FIGS. 7A and 7B, the memory cells shift one bit per cycle of Phi1 and Phi2.

FIG. 8 shows a logic element which implements a 16-bit shift register and 4-input lookup table according to a first embodiment of the invention. For simplicity, in FIG. 8 the structures within memory cells 770 of FIG. 7 have not been explicitly illustrated.

In FIG. 8, when in shift register mode, a first memory cell $770_1$ of the memory is programmed with an initial value. The memory cell's value may be over written with a new value by applying the new value to the $D_{in}$ terminal of the first memory cell $770_1$ and strobing the clock line, CK. The strobing of CK in turn invokes the two-phase clocking cycle of FIGS. 7A and 7B. As data is moved synchronously from left to right in the shift register, i.e., from the first memory cell $700_1$ to a last memory cell $700_{16}$, the logic element can continue to act as a lookup table though the function changes with every clock cycle. As in the prior art lookup tables, the decoding multiplexer 200 outputs on output line X the contents of the memory cell selected by the user inputs, i.e., F0–F3.

FIG. 9 shows a structure for implementing a 2-input lookup table or a 4-bit shift register, and shows internal structure of multiplexer 200 and memory cells $770_1$ through $770_4$. FIG. 9 is oriented on the page the same way as FIG. 8, and thus assists in understanding the relationship between the elements that make up the lookup table/shift register embodiment.

In a second embodiment of the present invention, a logic element is configurable to implement an n-bit shift register, an n-bit random access memory, and a ($\log_2$n)-input lookup table. FIGS. 10–12 illustrate this embodiment. FIG. 10 illustrates the memory cell. The memory cell of FIG. 10 can be loaded from three different sources. During configuration, memory cell $790_2$ is loaded by applying configuration data to line 704 and strobing control line 702 of transistor 706. When memory cell $790_2$ is in shift register mode, it is loaded through transistor 708, as discussed above. When memory cell $790_2$ is in RAM mode, it is loaded through demultiplexer 500 on line $705_2$. Write strobe line WS is pulsed, turning on transistor 707, and thus applying a data signal to node 730.

FIG. 11 shows a logic element which implements any one of a 16-bit shift register, a 16-bit random access memory, and 4-input lookup table according to the second embodiment of the present invention. In this embodiment, a memory cell, say $790_5$, of the lookup table is programmed with an initial value during configuration, as discussed above. Subsequently, the initial value may be replaced in either of two ways, depending on the mode of the logic element: shift or RAM.

When the lookup table including memory cells 790 is being used in RAM mode, each memory cell 790 receives its data input on RAM input line 705. To write to any memory cell 790, the write strobe line WS pulses, thereby driving the value of Din through demultiplexer 500 into the addressed memory cell via input line 730.

The operation of the logic element in each of these modes is controlled by control logic 1000. Control bits which specify whether the logic element is in RAM mode, shift mode, or neither are inputs to control logic unit 1000. Control logic unit 1000 also receives the user clock signal and the write enable signal. From these inputs, control logic unit 1000 outputs Phi1, Phi2 and write strobe signal WS to either shift data between memory cells, to write to a particular memory cell, or to leave the memory cell data untouched. When in shift register mode, as in FIG. 8, data is moved synchronously from left to right in the shift register, i.e., from the first memory cell $790_1$ to a last memory cell $790_{16}$, as described above, by invoking a two-phase clocking cycle when CK is strobed. On the other hand, when the logic element is configured as a random access memory (RAM), the addressing lines F0–F3 select one of the memory cells ($790_1$ through $790_{16}$) to be written to and read from by using the demultiplexer 500 and the decoding multiplexer 200, respectively. When in shift register mode, the first memory cell $790_1$ receives as its input the signal applied to line $D_{in}$. When in RAM mode, memory cell $790_1$ receives an input signal on line $705_1$ from demultiplexer 500.

In RAM mode, to write to a given memory cell, say $700_5$, the write enable line WE must be active. When the user clock signal CK is asserted in conjunction with the active WE signal, control logic unit 1000 generates a write strobe WS. When the write strobe WS is high, memory cell $700_5$ addressed by address lines F0–F3 of the demultiplexer 500 receives the value from data input line $D_{in}$. This value overwrites the previous contents of the memory cell $700_5$. No other memory cells receive the value applied to $D_{in}$ since they are not addressed and therefore separated from $D_{in}$ by high impedance connections from the demultiplexer 500.

FIG. 12 is a schematic illustration which shows more detail of a logic element according to the second embodiment of the present invention. Collectively, demultiplexer 500, decoding multiplexer 200, pass transistors 708 and 720, inverters 726, and RAM mode pass transistors 707 form an interconnection network and are combined with memory cells ($790_1$ through $790_4$) and control logic unit 1000 to implement the logic element according to the second embodiment. If the logic element of the second embodiment is not configured as a shift register, then the logic element acts as either a random access memory or a lookup table. In either non-shift register mode, Phi2 is maintained at a low level, deactivating pass transistors 708, thereby blocking data from one memory cell $790_i$ from affecting the next memory cell $790_{i+1}$. Also, in the non-shift register modes, Phi1 is maintained at a high logic level, thereby feeding the outputs of the memory cells ($790_1$ to $790_4$) through to the decoding multiplexer 200. As before, the output of the logic element is selected by the decoding multiplexer 200 according to the user inputs F0 and F1.

When the logic element of FIG. 12 is configured as a shift register, the RAM mode pass transistors 707 are turned off because WS is held low, isolating the memory cells from the outputs of demultiplexer 500. Memory cell $790_1$ is programmably connected to $D_{in}$ through transistor $708_1$. To shift values, control logic unit 1000 produces control signals Phi1 and Phi2, triggered while the write enable signal is active by a rising edge of the User Clock signal CK applied to control logic unit 1000 such that values are shifted from one memory cell to next memory cell, i.e., from memory cell $790_{i-1}$ to memory cell $790_i$, and from memory cell $790_i$ to memory cell $790_{i+1}$. When control logic unit 1000 receives a rising edge of the user clock signal, control logic unit 1000 first pulls Phi1 low, then pulses Phi2 high long enough to overwrite the contents of the memory cells ($790_1$ to $790_4$), and lastly reasserts Phi1 after Phi2 has fallen. It is important for extremely low clocking frequencies that Phi2 be only a pulse since Phi1 must be off while Phi2 is on. To accomplish this, the control logic is designed so that Phi1 and Phi2 do not rely on the falling edge of the User Clock signal 1008, but rather are self-timed.

Figure 13:
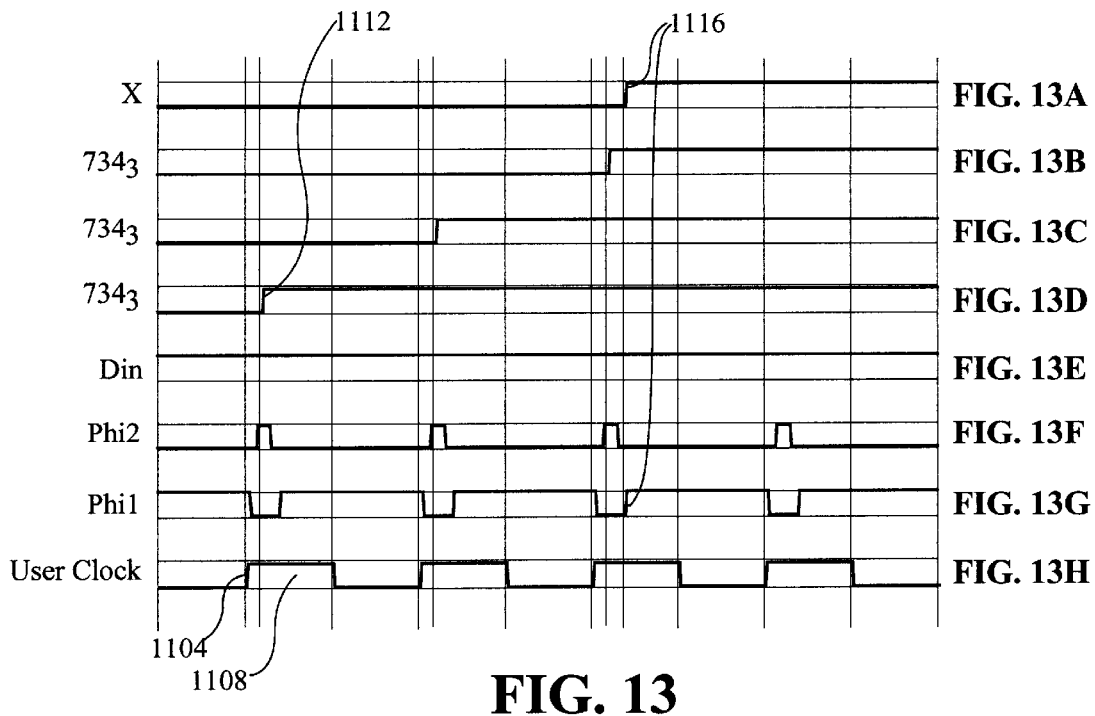
FIG. 13 comprising

FIG. 13 comprising FIGS. 13A through 13H are waveform diagrams of the operation of the logic element of FIG. 12, When the logic element of FIG. 12 is configured in shift-register mode, setting F1 to 1 and F0 to 0 makes it function as a three-bit shift register. As shown in FIG. 13E, the input, $D_{in}$, to the three-bit shift register is maintained continuously at a high logic level throughout the example. Upon receiving a rising edge 1104 of a first user clock pulse 1108, control logic unit 1000 pulls Phi1 to a low logic level, as shown in FIG. 13G, to deactivate pass transistors 720 (FIG. 12). After temporarily having isolated the outputs $734_1$ through $734_4$ of the memory cells ($790_1$ through $790_4$) from inputs of inverters $726_1$ through $726_4$, the control logic unit 1000 asserts Phi2, which propagates outputs of inverters $726_1$ through $726_4$ to their corresponding next memory cells, i.e., memory cells $790_2$ through $790_4$. When Phi2 is asserted, the value on $D_{in}$ is written to first memory cell $790_1$. The non-overlapping Phi2 pulse is shown in FIG. 13F. As shown in FIG. 13D, the value stored in first memory cell $790_1$ (corresponding to $734_1$) changes shortly after Phi2 is asserted. This change is indicated by reference 1112. The new value of output $734_1$ of the first memory cell $790_1$ does not affect the second memory cell $790_2$ (corresponding to $734_2$) because Phi1 is temporarily inactive. After asserting Phi2 long enough for the memory cells ($790_1$ to $790_4$) to reach their new states, Phi2 is lowered, thereby latching the data values. Only after Phi2 has been lowered does control logic unit 1000 raise Phi1.

On receiving the rising edge of Phi1, the values of outputs $734_1$ through $734_4$ again pass through pass transistors $720_1$ through $720_4$. Reference numeral 1116 shows that the change in the output X of the three-bit shift register is synchronized with the rising edge of Phi1. As seen in FIGS. 13G and 13H, the reassertion of Phi1 and the lowering of the User Clock are independent, thus logic designers need not depend on exact timing relationships between these two edges. Of course, Phi1 must be reasserted before the inputs of inverters $726_1$ through $726_4$ float to an invalid voltage.

Figure 14:
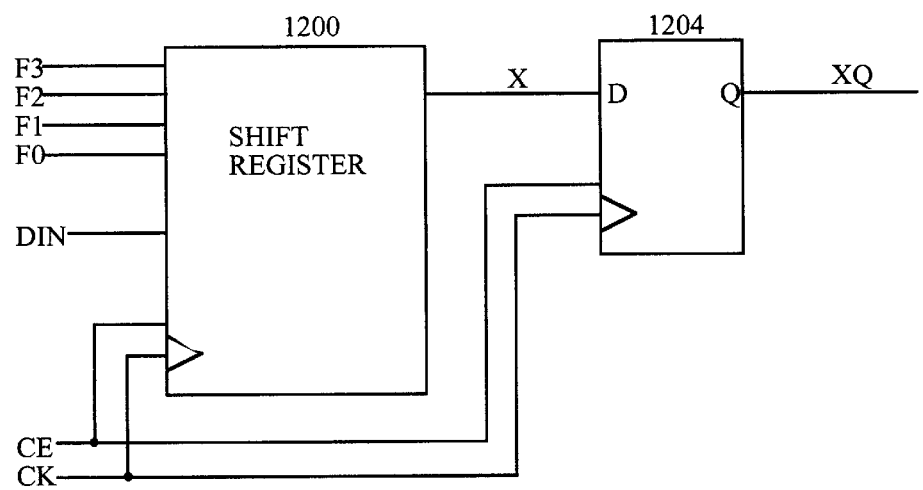
FIG. 14 is a block diagram of a logic element which includes both a shift register and a flip-flop.

FIG. 14 is a block diagram of a logic element which includes both a logic element 1200 and a flip-flop 1204. The purpose of the flip-flop is to improve the clock-to-out delay of the output of the logic element 1200. This is simple and efficient in Xilinx FPGAs because function generators are historically paired with flip-flops in Xilinx logic elements. Further, when an n-bit, synchronous shift register is required, the logic element can be configured so that the shift register 1200 is an (n−1)-bit shift register and flip-flop 1204 is the final register of the n-bit shift register. When configured in this alternative fashion, the final bit XQ is available upon the rising edge 1104 of the User Clock pulse 1108, rather than on the rising edge 1116 of Phi1. This provides a faster clock-to-out time for the overall n-bit shift register.

By configuring the logic element to route XQ back to $D_{in}$, the present invention can also perform circular shifts.

As discussed above (FIGS. 13A–13H), a shift register having fewer stages than the number of memory cells in a lookup table can be formed by directing a bit other than the last bit to output terminal X. Lookup tables likewise may be cascaded to create shift registers of a greater size than supported by a single lookup table. For example, it is possible to create a 20-bit shift register in a logic array composed of 16-bit lookup tables by cascading two logic elements. A first full 16-bit shift register 1200 and a second full 16-bit shift register 1200 combine to produce a 32-bit shift register. Thus, to achieve a 20-bit shift register, user input lines F0–F3 of the first logic element are set to 1111 and user input lines F0–F3 of the second logic element are 0011, i.e., the second 16-bit shift register 1200 is programmed to pass the output of the fourth memory cell $790_4$, which is the final output of the 20-bit shift register.

Additionally, in order to improve the clock-to-out delay of the cascaded shift registers, an alternate embodiment uses a first full 16-bit shift register 1200 addressed to 1111, a second full 16-bit shift register 1200 addressed to 0010 and the flip-flop 1204. The output, X, of the second shift register feeds the input of flip-flop 1204 of the second shift register. If desired, the flip-flops 1204 can also be used to extend the number bits that can be shifted within a logic element. Fully utilizing both 16-bit shift registers 1200 and their flip-flops 1204, cascaded shift registers can be built which are 17-bit, 34-bit, 51-bit, etc.

Figure 15:
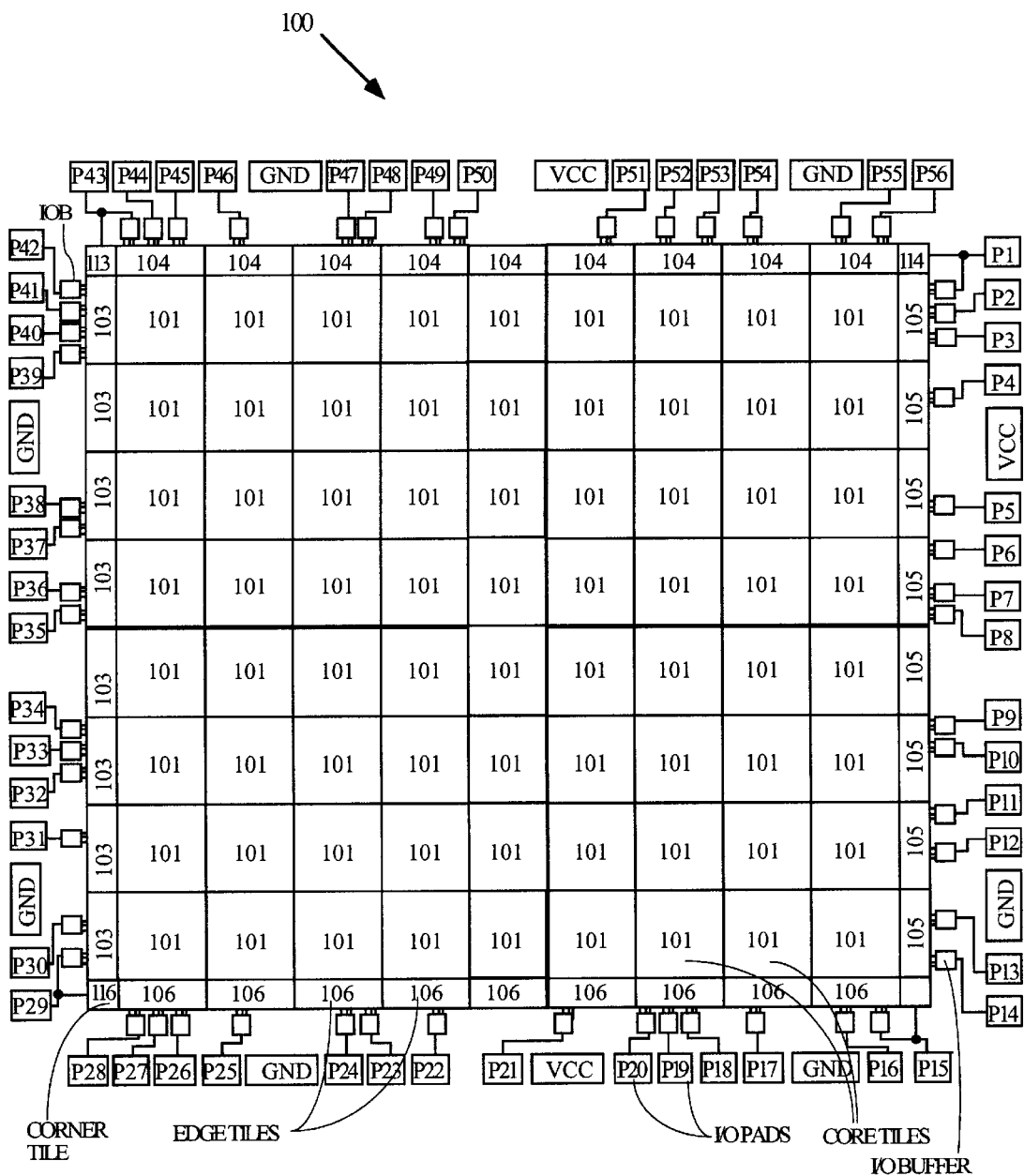
FIG. 15 is a block diagram of an FPGA.

The novel shift register logic element is typically implemented in an FPGA such as the FPGA of FIG. 15 having logic blocks 101, each comprising a portion of an interconnect structure and a logic element. The FPGA of FIG. 15 is further discussed by Tavana et al. in the application Ser. No. 08/618,445 incorporated herein by reference.

Figure 16:
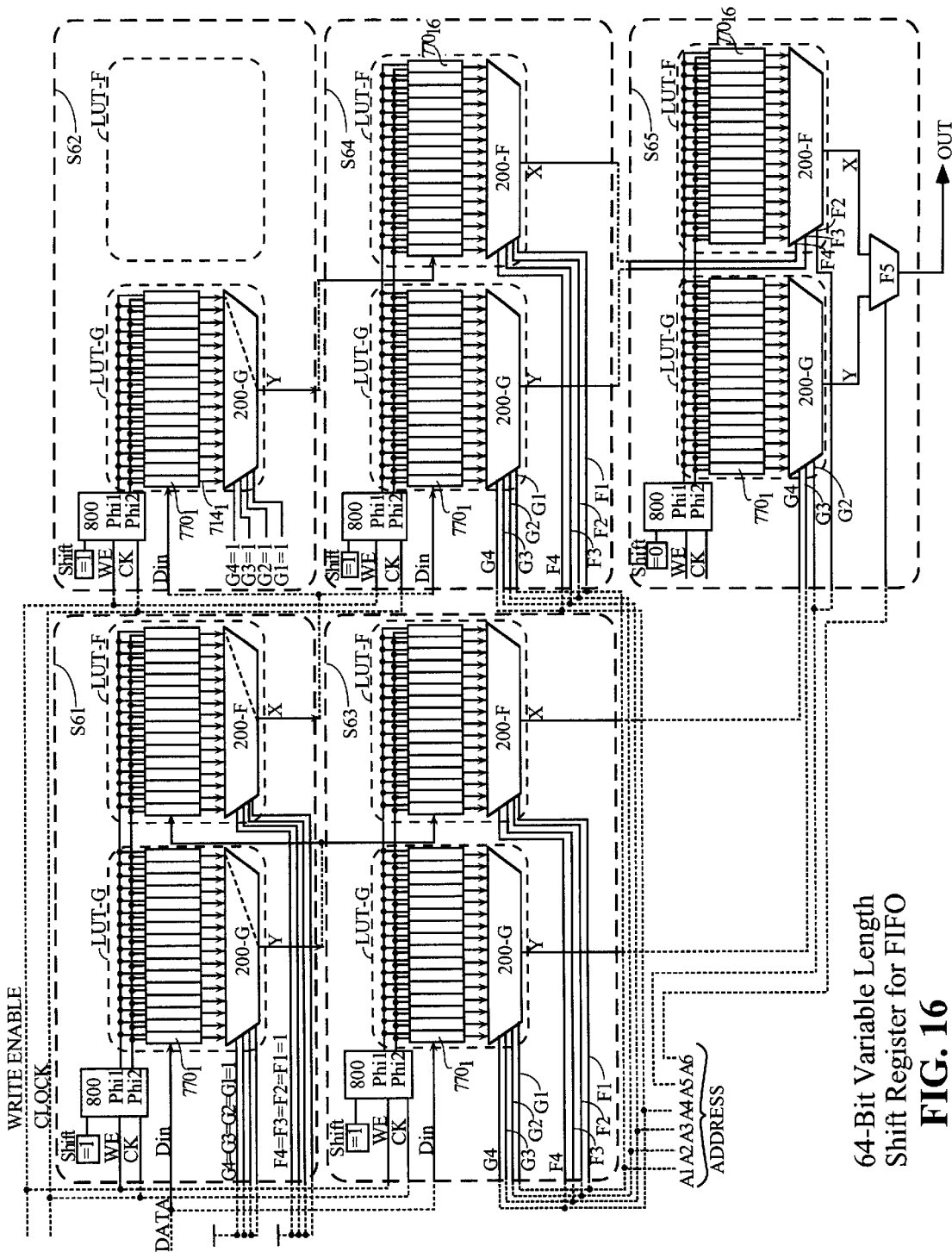
FIG. 16 shows a 64-bit variable length shift register formed by combining structures such as shown in FIG. 8.

FIG. 16 shows a 64-bit variable length shift register formed by combining structures such as shown in FIG. 8. Variable length shift registers are desired when building FIFOs (first-in-first-out storage devices).

Conventional FIFOs are commonly composed of a block of RAM addressed by READ and WRITE pointers which each increment through the block and cycle to the bottom upon reaching the top. When a word is written (pushed) into the FIFO, it is written to the address pointed to by the WRITE pointer, and the WRITE pointer is then incremented to point to the next address. When a word is read (popped) from the FIFO, it is taken from the address pointed to by the READ pointer and the READ pointer is incremented to the next address. Thus the data in a RAM based FIFO are never shifted. Rather, the READ and WRITE pointers are incremented independently.

In the present case using a shift register, whenever a WRITE command is received, data are always written to one location in a shift register and all other data are shifted one step through the shift register. In response to a WRITE command, a READ pointer is incremented. In response to a READ command, the READ pointer is decremented. There is no WRITE pointer. (The READ address represents the end of the string of stored data.) Such a shift register can be used to implement a variable length FIFO. If a shift register FIFO is desired that is no more than 16 words deep, then such a FIFO can be built in an FPGA using only one lookup table configured as a shift register for each bit of the word to be stored. If a FIFO is desired that can store more than 16 words, a structure such as shown in FIG. 16 must be built for each bit of the word. For example, a 64-word FIFO with 8-bit words would require 8 of the structures shown in FIG. 16. The structure of FIG. 16 can store up to 64 bits, the DATA bits being written from the left on data input line Din and being read out on the line OUT.

However, because the architecture of FIG. 8 provides only a single output from each LUT, (outputs are labeled X and Y), it is necessary to duplicate the data, an upper bank being used to store data for writing to subsequent lookup tables, and a lower bank being used for providing the particular data bit that has been addressed during a READ operation. A long shift register requires that the last sequential bit ($770_{16}$) of each 16-bit shift register be shifted to the first bit of the subsequent shift register, and that every bit be addressable by the READ address applied to the LUT output multiplexers 200. (If the FIFO is nearly empty, the READ address points to a memory cell near the left of the picture, for example cell $770_1$ of LUT-G of slice S63. If the FIFO is nearly full, the READ address points to a memory cell near the right of the picture, for example cell $770_{16}$ of LUT-F of slice S64.) Data bits are routed from one slice to another using the general interconnect routing lines. (These lines are illustrated using dotted lines to indicate that they are programmably connectable and to distinguish from the routing lines that are part of the slice itself.)

Using the architecture of FIG. 8, five slices S1 through S5 are used. A slice includes two lookup tables LUT-F and LUT-G, each comprising 16 memory cells $770_1$ through $770_{16}$, a multiplexer 200-F or 200-G, four LUT input lines F1 through F4 or G1 through G4 and a LUT output line X or Y. The slice also includes a clocking structure 800 receiving write enable signal WE, clock input signal CK, and a shift control signal from, for example, a configuration memory cell. Clocking structure 800 generates two non-overlapping clocking signals Phi1 and Phi2, as discussed earlier (See FIGS. 7A and 7B). These clocking signals Phi1 and Phi2 operate to shift bits to the right in response to clock signal CK when the shift memory cell contains a logic 1 and when the write enable signal WE is logic 1. In order to provide that the last bit $770_{16}$ of lookup table LUT-G of slice S61 is fed to lookup table LUT-F of slice S63, while simultaneously allowing an addressed bit to be read from any of four lookup tables (two in slice S63 and two in slice S64), it is necessary to duplicate three of the four lookup tables and to configure the lookup tables so that in one lookup table the last bit is always routed out through multiplexer 200-F or 200-G to the first bit of the next shift register, and in the duplicate lookup table, the addressed bit is read. Thus, the addressed bit is read from the addressed lookup tables LUT-G of slice S63, LUT-F of slice S63, LUT-G of slice S64, or LUT-F of slice S64 while the last bit of lookup table LUT-G of slice S61, LUT-F of slice S61, or LUT-G of slice S62 is shifted in to the first bit of lookup table LUT-F of slice S63, LUT-G of slice S64 of LUT-F of slice S64, respectively, regardless of which address is being read out. Since lookup table LUT-F of slice S64 is the last in the chain, it is not necessary to form a duplicate in lookup table LUT-F of slice S62. (Recall that the data stored in slice S61 is identical to the data stored in slice S63, and the data stored in LUT-G of slice S62 is identical to the data stored in LUT-G of slice S64.)

As another aspect of the particular architecture of FIG. 8, discussed by Young, Chaudhary, and Bauer in pending U.S. patent application Ser. No. 08/806,997, the content of which is incorporated herein by reference, multiplexers are included for generating five (F5) and six (F6) input functions by combining the outputs of the four-input lookup tables LUT-F and LUT-G. But in that described embodiment, the same input signal that feeds the Din signal also serves as the control signal on the F5 multiplexer. Thus, it is not possible to use an address signal for controlling the F5 multiplexer when also using that signal for supplying data. Thus a fifth slice S65 is used. The LUT-F and LUT-G lookup tables and an F5 multiplexer of slice S65 are configured to implement a four-to-one multiplexer, the output signal from this multiplexer being the addressed bit.

FIG. 17 shows a 64-bit variable length shift register formed using an architecture with an advantageous modification to the structure of FIG. 8. By changing the architecture to add a two-to-one multiplexer to the data input of each shift register and feeding the output signal of the last memory cell of the previous shift register to that multiplexer (in addition to the signal from the interconnect structure that exists in FIG. 8), a variable length shift register can be formed using no more than half the number of lookup tables of FIG. 16. The structure of FIG. 17 is configured as a 64-bit variable length shift register, just as is the structure of FIG. 16. But since the structure of FIG. 17 includes multiplexers M71 and M72 as inputs to the respective lookup table shift registers, each lookup table has both a variable-tap output through multiplexer 200 and a fixed output from cell $770_{16}$. This is advantageous for making a FIFO because each lookup table now has the two outputs required when cascading together logic elements to build a long variable-tap shift register, so no duplication of logic is required. And the READ address dynamically addresses one of the 64 memory cells via the four lookup table input signals and the F5 and F6 multiplexers. Note that using the shift input of the newly added multiplexer M71 or M72 allows the BY or BX input of the newly added multiplexer to be used for another function, in this case controlling an F5 or F6 multiplexer.

FIG. 18 shows a logic slice structure from which the 64-bit variable length shift register of FIG. 17 can be formed, and in particular shows connections of the F5 multiplexer and another multiplexer labeled FX. A preferred architecture combines four of these slices into one configurable logic block (CLB). The FX multiplexer can be an F6, F7, or F8 multiplexer, depending upon the position of the illustrated slice in the CLB, where an F6 multiplexer selects between outputs of two F5 multiplexers, an F7 multiplexer selects from two F6 multiplexers, and an F8 multiplexer selects from two F7 multiplexers. FIG. 18 illustrates that the BX input signal goes two places: to multiplexer M72 and to the control terminal of the F5 multiplexer. Similarly, the BY input signal goes to multiplexer M71 and to the control terminal of the FX multiplexer. Note that the input signals to the FX multiplexer are labeled FXin0 and FXin1. These input signals come from other F5 or FX multiplexers within the CLB, and they are most conveniently illustrated in FIG. 19. In a preferred embodiment, a logic slice structure such as that of FIG. 18 will include additional elements, for example flip flops, fast carry circuits, and routing structures (see, for example, U.S. Pat. Nos. 5,267,187 to Hsieh et al., and 5,349,250 to New, as well as U.S. patent application Ser. No. 08/806,997 referenced above). However, to avoid obscuring the present invention, these additional structures have not been shown here.

FIG. 19 shows a layout of wiring for cascading adjacent lookup table slices by which interiors of adjacent lookup table slices can be identically laid out and by which a single input line BX or BY can serve a function in an earlier architecture as well as a new function discussed here (so the new architecture discussed here can implement designs that have been implemented in the previous architecture illustrated in FIG. 16). FIG. 19 illustrates one configurable logic block (CLB) comprising four slices, each having two lookup tables (LUTs). Each slice is equivalent to that of FIG. 18. Whereas FIG. 18 shows one F5 multiplexer and one FX multiplexer (in addition to the two M71 and M72 multiplexers discussed earlier), FIG. 19 shows the different interconnections to the FX multiplexer in different parts of one CLB. These wide function multiplexers are now labeled F6, F7, and F8 to show the number of input signals they can provide all function of. Thus, the F8 multiplexer selects from the output signals of two F7 multiplexers and an F7 multiplexer selects from two F6 multiplexers and so on. The lookup tables themselves provide all functions of four input signals. Note that the F8 multiplexer receives one input signal from the F7 multiplexer of its own CLB and another input signal from the F7 multiplexer of an adjacent CLB. Note also that one CLB includes four F5 multiplexers, two F6 multiplexers, one F7 multiplexer, and one F8 multiplexer.

The novel and advantageous placement of these wide function multiplexers always allows the control signal BX or BY to serve the dual function of providing shift-in data and controlling a corresponding multiplexer. This is because only one of the BX or BY terminals will be used for shifting in data to a shift register, and the sharing is arranged so that the highest order multiplexer is placed at the beginning of the shift register for that length. In the case of a 64-bit shift register, two slices will be used (see FIG. 17). The address will be six bits long and will use two F5 multiplexers and one F6 multiplexer. Looking at FIG. 19, this can be accomplished in either the upper two slices S3 and S2 or in the lower two slices S1 and S0. In either case, data will be shifted in on line BY of slice S3 or S1, and multiplexer M71 of the slice will be set to receive the BY signal. The F7 or F8 multiplexer will not be used since the desired output signal is provided by the F6 multiplexer of slice S2 or S0. Thus there is no conflict that the line used for controlling the F7 or F8 multiplexer is used in this case as a data input line to the shift register.

If a 128-bit shift register is desired, the entire CLB of FIG. 19 will be used. Data will be shifted in on the BY line of slice S3 and the output signal will be taken from the F7 multiplexer. The F8 multiplexer will not be used. Thus, again, there is no conflict in the fact that the line used for controlling multiplexer F8 is used to provide data to the shift register. Similarly, if a 256-bit shift register is desired, two CLBs of the type shown in FIG. 19 will be used, data being shifted in to the upper of the two CLBs and the output signal taken from the F8 multiplexer of the lower CLB. So again there is no conflict. Knowing this relationship, architectures can be provided having longer patterns of multiplexers for providing larger functions. All this is possible because for n-input lookup tables we need (n−1) lines for controlling multiplexers and 1 line for shifting in data to a shift register. The (n−1) multiplexer control signals plus 1 data-in signal exactly match the n lines provided.

Shift registers of sizes other than powers of two can also be formed by combining the appropriate number of slices. For example, if a user wanted a 200-bit variable length shift register, this could be implemented in seven slices using 13 LUTs, seven F5 multiplexers, four F6 multiplexers, two F7 multiplexers, and one F8 multiplexer. The three LUTs not needed in the eight slices that feed the F8 multiplexer could be used for other functions. To avoid generating an erroneous output signal if one of the unused lookup tables is addressed, the control inputs for the F5 and F6 multiplexers associated with partially used slices are preferably tied to a constant value.

FIG. 20 shows more detail of the structure of FIG. 19, illustrating the lookup table structures and clocking structures discussed earlier. Since the additional details of FIG. 20 have been discussed earlier, they are not discussed again here.

Numerous modifications and variations of the present invention are possible in light of the above teachings. Although FIGS. 7 and 10 show a memory cell programmed through only one node of the latch, the invention can also be used with memory cells in which some data signals are inverted and applied to both nodes of the latch, or in which different control signals are applied to different nodes of the latch. Further, in FIG. 10 the three transistors 706, 708, and 707 can be implemented as a multiplexer receiving input signals on lines 704, 714, and 705. And transistors 706, 708, 707, and 720 can be replaced by transmission gates. While particular multiplexer and demultiplexer implementations are shown, the invention can use other implementations as well. And, of course, different structures and methods for generating signals such as Phi1, Phi2, and WS can be used with the invention. Further, although the above embodiments show a single multiplexer with a single output terminal for selecting one signal from a plurality of memory cells, other embodiments can select more than one memory cell from which to provide an output signal. And although FIGS. 19 and 20 show a CLB with lookup tables and multiplexers for generating functions of up to 8 input signals, other embodiments can use CLBs with more lookup tables and higher order multiplexers, for example CLBs with 16 or 32 lookup tables with F9 and F10 multiplexers. A lookup table can have fewer or more than the 16 memory cells shown. For example, a 6-input lookup table would use 64 memory cells (configurable as a shift register) and the combining multiplexers would start with F7. Further, although the cascading aspect of the invention has been discussed in comparison to FIG. 8, this aspect also applies to structures with demultiplexing, such as shown in FIG. 11. More fundamentally, although the above invention has been described in connection with an FPGA, a shift register with cascade multiplexers can be formed in other structures than FPGAs, and formed not in connection with lookup tables.

It is therefore to be understood that within the scope of the appended claims, the invention may be practiced otherwise than as specifically described above.

We claim:

1. In a field programmable gate array (FPGA) having lookup tables configurable as shift registers, a FIFO comprising:

a data shift register formed in a plurality of the lookup tables; and a routing structure comprising a first cascade multiplexer configured to receive FIFO data and at least a second cascade multiplexer configured to pass FIFO data from a last memory cell of a first lookup table to a first memory cell of a second lookup table;

whereby shift register data can be shifted through a selected number of shift register cells, each of which can be addressed.

2. The FIFO of claim 1 wherein the FPGA further comprises having cascade multiplexers for cascading adjacent lookup table shift registers together.

3. The FIFO of claim 2 wherein the FPGA further comprises a wide function multiplexer receiving as input signals the output signals from two adjacent lookup tables and wherein four READ address signals are routed to four input terminals of both of the two adjacent lookup tables and a fifth READ address signal is routed to a control terminal of the wide function multiplexer.

4. The FIFO of claim 1 wherein a push function comprises shifting data in the data shift register and incrementing a READ address, and wherein a pop function comprises reading data at the READ address and decrementing the READ address.

* * * * *